(12) United States Patent  
Kawabata

(10) Patent No.: US 7,816,783 B2  
(45) Date of Patent: Oct. 19, 2010

(54) RESIN WIRING SUBSTRATE, AND SEMICONDUCTOR DEVICE AND LAMINATED SEMICONDUCTOR DEVICE USING THE SAME

(75) Inventor: Takeshi Kawabata, Kadoma (JP)

(73) Assignee: Panasonic Corporation, Osaka (JP)

( * ) Notice: Subject to any disclaimer, the term of this patent is extended or adjusted under 35 U.S.C. 154(b) by 162 days.

(21) Appl. No.: 11/878,538

(22) Filed: Jul. 25, 2007

(65) Prior Publication Data  
US 2008/0067661 A1 Mar. 20, 2008

(30) Foreign Application Priority Data  
Sep. 14, 2006 (JP) ............................. 2006-248812

(51) Int. Cl.  
*H01L 23/14* (2006.01)

(52) U.S. Cl. .................. 257/702; 257/777; 257/686; 257/E23.007; 438/125; 438/457

(58) Field of Classification Search ............... 257/686, 257/777, 700, E25.031, E23.007, 702; 438/125, 438/457  
See application file for complete search history.

(56) References Cited  
U.S. PATENT DOCUMENTS  
2001/0022391 A1* 9/2001 Ishihara et al. .............. 257/676  
2003/0197260 A1* 10/2003 Nishimura et al. .......... 257/686

FOREIGN PATENT DOCUMENTS  
JP 3-40457 2/1991  
JP 9-172104 6/1997  
JP 09/172104 * 6/1997

* cited by examiner

*Primary Examiner*—Kimberly D Nguyen  
*Assistant Examiner*—Maria Ligai  
(74) *Attorney, Agent, or Firm*—Steptoe & Johnson LLP

(57) ABSTRACT

On a surface of a resin base material (11), a first resin coating film (19) having a larger thickness and a larger area than a second resin coating film (20) formed on the other surface of the resin base material (11) is continuously formed. The second resin coating film (20) is formed so as to be separated into a plurality of portions.

23 Claims, 12 Drawing Sheets

RESIN WIRING SUBSTRATE, AND SEMICONDUCTOR DEVICE AND LAMINATED SEMICONDUCTOR DEVICE USING THE SAME

The present application claims priority to Japanese Patent Application No. 2006-248812, filed Sep. 14, 2006, which application is incorporated herein by reference in its entirety.

FIELD OF THE INVENTION

The present invention relates to a resin wiring substrate to mount a semiconductor element, and semiconductor device and laminated semiconductor device using the same.

BACKGROUND OF THE INVENTION

In semiconductor devices, cost reduction is required in addition to size reduction and thickness reduction. Therefore, in a semiconductor device of a BGA (ball grid array) structure and a CSP (chip size package) structure, a resin wiring substrate is used as a substrate to mount a semiconductor element. Normally, wiring patterns are formed on both surfaces of the resin wiring substrate, and in a semiconductor device using the resin wiring substrate, a semiconductor element is mounted on a surface of the resin wiring substrate, and solder balls for connecting to external connecting terminals are provided on the other surface of the resin wiring substrate. Also in both surfaces of the resin wiring substrate, a region excluding a bonding portion for connecting with the semiconductor element and a land portion for connecting solder balls is coated with a solder resist to protect wiring patterns and via portions.

In recent years, however, a very thin substrate having a thickness of about 0.3 mm or less has been used in such a semiconductor device, due to requirement for size reduction and thickness reduction. Therefore, a problem wherein such a semiconductor device is liable to warpage has arisen.

To cope with such a problem, Japanese Patent Application Laid-Open No. 3-40457 proposes a configuration for suppressing the warpage of a semiconductor device, wherein a semiconductor element mounted on a surface of a resin wiring substrate is entirely coated with a resin for encapsulation, and a region of the other surface corresponding to the region encapsulated by the resin is also encapsulated by the same resin.

However, since the thickness of a semiconductor element is normally at least 0.2 mm, and the resin must be thicker than the thickness of the semiconductor element, the above-described conventional configuration wherein the same resin films in thickness are formed on both surfaces of the substrate cannot sufficiently satisfy the requirement for thinning. There is also a problem wherein such a configuration cannot be applied to a package of a BGA type at all.

Japanese Patent Application Laid-Open No. 9-172104 proposes another configuration for suppressing the warpage of a semiconductor device. Specifically, there is proposed a configuration wherein the ratio of the coating area of a solder resist coating a surface of a resin wiring substrate to the coating area of a solder resist coating another surface of the resin wiring substrate is set within a range between about 1:1.3 and 1:1.7; and the ratio of the thickness of the solder resist coating a surface of the resin wiring substrate to the thickness of the solder resist coating another surface of the resin wiring substrate is set within a range between 3:1 and 5:1.

However, in such a configuration, the rigidity of the resin wiring substrate is elevated. Therefore, if a semiconductor element is mounted as a flip chip on the resin wiring substrate of such a configuration, thermal stress caused by the difference in the coefficients of thermal expansion between the resin wiring substrate and the semiconductor element acts on a connecting portion of the resin wiring substrate and the semiconductor element to easily cause poor connection at the connecting portion, and the breakdown of the vicinity of corners of the resin wiring substrate side of the semiconductor element (including inside the semiconductor element).

DISCLOSURE OF THE INVENTION

It is an object of the present invention to provide a resin wiring substrate that can reduce thermal stress applied to a connecting portion of the resin wiring substrate to a semiconductor element and the vicinity of corners of the resin wiring substrate side of the semiconductor element (including inside the semiconductor element) when the semiconductor element is mounted, and can reduce the warpage of the entire system; and a semiconductor device and a laminated semiconductor device using the same.

Specifically, in order to achieve the above-described object, a resin wiring substrate according to the present invention at least includes a resin base material, a plurality of connecting terminals formed in a semiconductor element mounted region on a surface of the resin base material, a plurality of external connecting terminals formed on the other surface of the resin base material, a first resin coating film formed in an external region excluding the semiconductor element mounted region on the surface of the resin base material, and a second resin coating film formed on the other surface in a shape exposing at least a part of each of the external connecting terminals; wherein the first resin coating film has a larger thickness and a larger area than the second resin coating film, and is continuously formed; and the second resin coating film is formed so as to be separated into a plurality of portions.

Furthermore, the first resin coating film and the second resin coating film may be composed of the same material. The material may be a solder resist.

Furthermore, a thickness of the resin base material may be less than or equal to a thickness of a semiconductor element mounted on the resin base material.

Furthermore, the external connecting terminals and the second resin coating film may be mainly formed in a region excluding a region corresponding to the semiconductor element mounted region on the other surface.

Furthermore, the external connecting terminals and the second resin coating film may be formed only in the region corresponding to the semiconductor element mounted region on the other surface.

Furthermore, the second resin coating film may be separated in at least a part between the external connecting terminals.

Furthermore, a plurality of connecting terminals for lamination may be provided in the external region of the surface.

A semiconductor device according to the present invention includes the resin wiring substrate according to the present invention.

A first laminated semiconductor device according to the present invention includes:

a first semiconductor device including the resin wiring substrate according to the present invention as a lamination substrate; and a second semiconductor device including the resin wiring substrate according to the present invention further having a plurality of connecting terminals for lamination in the external region on the surface; wherein the external connecting terminals of the resin wiring substrate in the first semiconductor device are used as inter-substrate connecting terminals, to connect the connecting terminals for lamination of the second semiconductor device to the inter-substrate connecting terminals of the first semiconductor device via a protruded electrode for lamination.

A second laminated semiconductor device according to the present invention includes:

a first semiconductor device including:

a laminated substrate at least including:

a resin base material, a plurality of connecting terminals formed in a semiconductor element mounted region on a surface of the resin base material, a plurality of inter-substrate connecting terminals formed on the other surface of the resin base material, a first resin coating film formed in an external region excluding the semiconductor element mounted region on the surface of the resin base material, and a second resin coating film formed on the other surface in a shape exposing at least a part of each of the inter-substrate connecting terminals; wherein the first resin coating film is formed so as to be thinner than the second resin coating film; and a second semiconductor device including the resin wiring substrate according to the present invention further having a plurality of connecting terminals for lamination in the external region on the surface; wherein the connecting terminals for lamination of the second semiconductor device are connected to the inter-substrate connecting terminals of the first semiconductor device via a protruded electrode for lamination.

Furthermore, the first resin coating film of the first semiconductor device may have an area smaller than an area of the second resin coating film of the first semiconductor device.

Furthermore, the second resin coating film of the first semiconductor device may be formed so as to have a thickness larger than a thickness of the semiconductor element mounted on the first semiconductor device.

Furthermore, the first resin coating film of the second semiconductor device may be formed so as to have a thickness larger than a thickness of the semiconductor element mounted on the second semiconductor device.

According to the resin wiring substrate of the present invention, since the resin base material is easily deformed in the semiconductor element mounting region, the stress of the connecting portion can be reduced, and since the deformation of the resin base material can be relieved by the first resin coating film, the warpage of the entire system can be reduced. In addition, since the warpage in the peripheral portion can be reduced, the resin wiring substrate according to the present invention is useful for a laminated semiconductor device. Therefore, according to the resin wiring substrate of the present invention, a thin semiconductor device (including laminated semiconductor devices) having a BGA configuration that can reduce poor connection, such as breakdown at the vicinity of the corners in the resin wiring substrate side of the semiconductor element (including inside the semiconductor element) having high connection reliability can be realized.

Specifically, according to the resin wiring substrate of the present invention, since the first resin coating film having a larger thickness and larger area than the second resin coating film is continuously formed in the external region of the resin base material and the second resin coating film is formed so as to be separated into a plurality of portions, the portion (the semiconductor element mounted portion) of the resin base material corresponding the semiconductor element mounted region can be flexibly deformed. Therefore, stress acting on the connecting portion between the semiconductor element and the resin wiring substrate (specifically the connecting portion between the protruded electrodes of the semiconductor element and the connecting terminals of the resin wiring substrate) can be reduced. Thereby, the occurrence of defects, such as poor connection at the connecting portion between the semiconductor element and the resin wiring substrate, the breakdown of the vicinity of corners in the resin wiring substrate side of the semiconductor element, and the separation of the semiconductor element from the resin wiring substrate, can be suppressed, and the reliability of the semiconductor device can be improved.

At the same time, according to the resin wiring substrate of the present invention, the warpage of the portion corresponding to the region excluding the semiconductor element mounted region of the resin base material (peripheral portion) is reduced by the first resin coating film. Specifically, in the peripheral portion, since the effect of the stress of the first resin coating film is larger than the stress of the second resin coating film, the warpage of the peripheral portion is particularly improved. (Although the semiconductor element mounted region warps due to difference in linear expansion coefficients between the semiconductor element and the resin wiring substrate, the warpage of the peripheral portion is improved.) Therefore, according to the resin wiring substrate of the present invention, the warpage of the entire resin wiring substrate can be reduced even after the semiconductor element has been mounted, and connection to a circuit board, such as a mother board, of the semiconductor device becomes ensured and reliable.

Therefore, according to the resin wiring substrate of the present invention, a thin and reliable semiconductor device that can suppress defects, such as poor connection at the connecting portion between the semiconductor element and the resin wiring substrate, defective mounting to the mother board, and breakdown in the vicinity of the corners in the resin wiring substrate side of the semiconductor element, can be realized.

The external connecting terminals and the second resin coating film may be formed mainly in the region excluding the region corresponding to the semiconductor element mounted region on the other surface. According to such a configuration, since the first resin coating film and the second resin coating film are not formed on both surfaces of the semiconductor element mounted portion, the semiconductor element mounted portion of the resin base material can be easily deformed. Therefore, according to such a configuration, the occurrence of defects, such as poor connection at the connecting portion between the semiconductor element and the resin wiring substrate, the breakdown of the vicinity of corners in the resin wiring substrate side of the semiconductor element, and the separation of the semiconductor element from the resin wiring substrate, can be further suppressed, and the resin wiring substrate having high reliability can be realized.

The second resin coating film may be formed in the peripheral portion of the external connecting terminals, and can be separated in at least a part between the external connecting terminals. According to such a configuration, the protruded electrodes for connection can be easily and surely formed by plating on the external connecting terminals. The second resin coating film may have a configuration separated at all the spaces between the external connecting terminals, or may have a configuration connected between a plurality of external connecting terminals to form blocks, and separated between such block units.

The external connecting terminals and the second resin coating film can also be formed only in the semiconductor element mounting portion. According to such a configuration, since the effect by the stress of the first resin coating film in the peripheral portion becomes larger, the warpage of the peripheral portion can be further improved. In addition, since the range where the external connecting terminals are present is limited to the semiconductor element mounted portion, the fluctuation of warpage of the external connecting terminals (coplanarity) is improved compared with the case wherein the external connecting terminals are present in the entire surface of the other surface of the resin base material. Since no external connecting terminals are present in the peripheral portion, no poor connection occurs in the peripheral portion.

By further forming the connecting terminals for lamination for connecting to the laminated substrate in the external region of the plane (a surface) of the semiconductor element mounting side of the resin base material, and forming the first resin coating film in a shape for exposing the connecting terminals for lamination, a laminated substrate can be further mounted on a surface of the resin wiring substrate, and the resin wiring substrate that can realize a semiconductor device of a higher density can be obtained.

According to the semiconductor device (including laminated semiconductor devices) of the present invention, a higher-functional thin semiconductor device of high reliability can be realized. The semiconductor device can be easily connected to a mother board. Poor connection at the connecting portion between the semiconductor element and the resin wiring substrate, and the connecting portion between the semiconductor element and the laminated substrate, and the breakdown in the vicinity of corners in the substrate side of the semiconductor element can be prevented.

Furthermore, according to the laminated semiconductor device of the present invention, since the first resin coating film of the laminated substrate can be formed thinner than the second resin coating film, the laminated substrate warps in the direction wherein the connection distance between the inter-substrate connecting terminals of the laminated substrate and the connecting terminals for lamination of the resin wiring substrate is shortened, and poor connection between the inter-substrate connecting terminals and the connecting terminals for lamination can be prevented. By making the area of the first resin coating film smaller than the area of the second resin coating film, the connection distance between the inter-substrate connecting terminals of the laminated substrate and the connecting terminals for lamination of the resin wiring substrate can be shortened. Also by making the thickness of the second resin coating film of the laminated substrate larger than the thickness of the semiconductor element mounted on the laminated substrate, the connection distance between the inter-substrate connecting terminals of the laminated substrate and the connecting terminals for lamination of the resin wiring substrate can be shortened. Also by making the thickness of the first resin coating film of the resin wiring substrate larger than the thickness of the semiconductor element mounted on the resin wiring substrate, the resin wiring substrate warps in the direction wherein the connection distance between the inter-substrate connecting terminals of the laminated substrate and the connecting terminals for lamination of the resin wiring substrate is shortened, and thus the connection distance between the inter-substrate connecting terminals of the laminated substrate and the connecting terminals for lamination of the resin wiring substrate can be further shortened.

DESCRIPTION OF THE EMBODIMENTS

Figure 1:
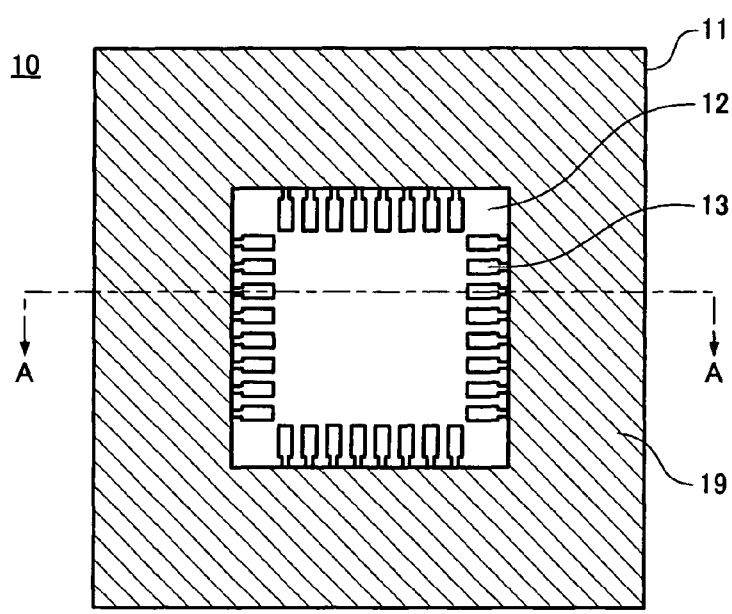
FIG. 1 is a schematic plan view of a resin wiring substrate according to a first embodiment of the present invention viewed from a semiconductor element mounting side.

The embodiments of the present invention will be described in detail hereunder referring to the drawings. The thickness, length, number and the like of each member in the drawings are different from actual values for the convenience of preparing the drawings. The same members are denoted by the same symbols, and the description thereof may be omitted.

First Embodiment

Figure 2:
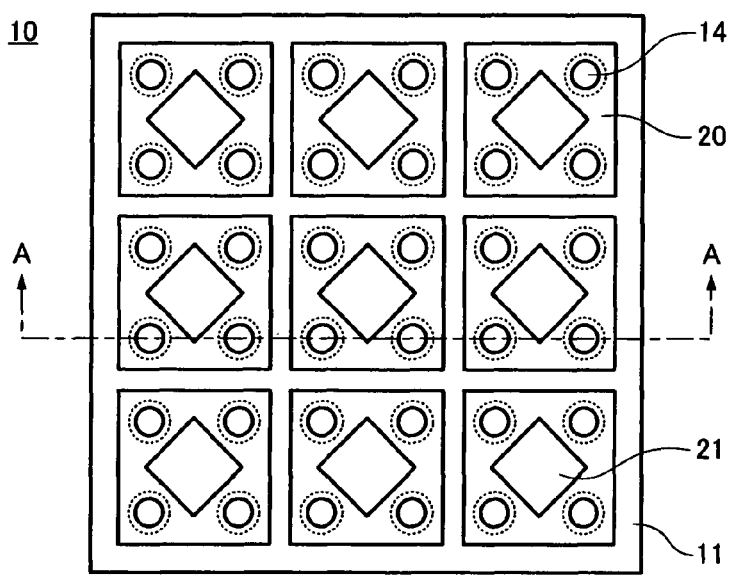
FIG. 2 is a schematic plan view of the resin wiring substrate viewed from the side opposite to the semiconductor element mounting side.

FIG. 1 is a schematic plan view of a resin wiring substrate according to the first embodiment of the present invention viewed from a semiconductor element mounting side; FIG. 2 is a schematic plan view of the resin wiring substrate viewed from the side opposite to the semiconductor element mounting side; and FIG. 3 is a schematic sectional view of the resin wiring substrate taken along line A-A shown in FIGS. 1 and 2.

FIGS. 4 to 7 are schematic sectional views illustrating major steps in the process for manufacturing a semiconductor device according to the first embodiment of the present invention. The semiconductor device according to the first embodiment has a configuration shown in FIG. 7.

Figure 3:
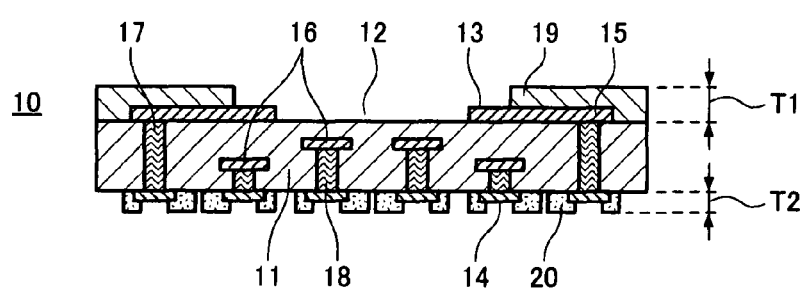
FIG. 3 is a schematic sectional view of the resin wiring substrate taken along line A-A shown in FIGS. 1 and 2.

As shown in FIGS. 1 and 3, on substantially the center portion of a surface (the surface in the semiconductor element mounting side) of a resin base material 11, a semiconductor element mounting region 12 having a shape substantially similar to the top-view shape of a semiconductor element mounted on a resin wiring substrate 10, and an area slightly larger than the area of the semiconductor element mounted on the resin wiring substrate 10 is provided in the resin wiring substrate 10. In the semiconductor element mounting region 12, connecting terminals 13 are formed in the arrangement corresponding to the electrode terminals of the semiconductor element mounted on the resin wiring substrate 10.

As shown in FIGS. 2 and 3, on the other surface (the surface opposite to the semiconductor element mounting side) of the resin base material 11, external connecting terminals 14 are formed.

As shown in FIG. 3, a wiring pattern 15 is formed on the surface of the resin base material 11. In the resin base material 11, wiring patterns 16 and via conductors 17 and 18 are formed. The wiring patterns 15 and 16, and the via conductors 17 and 18 connect the connecting terminals 13 with the external connecting terminals 14.

As shown in FIGS. 1 to 3, a first resin coating film 19 is formed on the surface of the resin base material 11, and a second resin coating film 20 is formed on the other surface of the resin base material 11. In the first embodiment, the first resin coating film 19 and the second resin coating film 20 are composed of a solder resist.

As shown in FIGS. 1 and 3, the first resin coating film 19 is continuously formed in a region excluding the semiconductor element mounting region 12 (external region), and the first resin coating film 19 is formed so as to have a thickness T1 larger than a thickness T2 of the second resin coating film 20.

As shown in FIGS. 2 and 3, the second resin coating film 20 is formed so as to have a shape to expose a part of each external connecting terminal 14, and so that the entire area thereof is smaller than the area of the first resin coating film 19. Specifically in the first embodiment, the second resin coating film 20 is formed on a peripheral portion of each external connecting terminal 14, and is separated into a plurality of (nine) blocks as shown in FIG. 2. From each of the independent blocks, a plurality of (four) external connecting terminals 14 are exposed. Furthermore, an opening 21 is formed in the center portion of each block. By thus separating the second resin coating film 20 into the plurality of independent blocks and providing the opening 21 in each block, the area of the second resin coating film 20 is made to be smaller than the area of the first resin coating film 19.

As described above, in the first embodiment, the thickness T1 of the first resin coating film 19 was made to be larger than the thickness T2 of the second resin coating film 20 to form them continuously in the external region of the resin base material 11, and the area of the second resin coating film 20 was made to be smaller than the area of the first resin coating film 19. Thereby, when a thin resin base material 11 is used, the rigidity of a portion corresponding to the semiconductor element mounting region 12 (semiconductor element mounting portion) of the resin wiring substrate 10 can be reduced to make the semiconductor element mounting portion flexible and deformable; while the warpage of the resin wiring substrate 10 can be reduced by the first resin coating film 19 formed on the external region of the resin base material 11. In other words, by forming the second resin coating film 20 to have smaller thickness and smaller area than the first resin coating film 19, the stress of the second resin coating film 20 is reduced, and the semiconductor element mounting portion of the resin wiring substrate 10 where the first resin coating film 19 is not formed is made deformable. At the same time, the stress of the second resin coating film 20 is made to be smaller than the stress of the first resin coating film 19 to reduce the warpage of the resin wiring substrate 10 in a portion corresponding to the external region of the resin base material 11 (peripheral portion). Furthermore, by forming the second resin coating film 20 so as to be separated, the effect of the stress of the second resin coating film 20 is further reduced.

An example of a specific configuration of the resin wiring substrate 10 will be described hereunder. For example, when the thickness of the semiconductor element mounted on the resin base material 11 is 300 µm, the thickness of the resin base material 11 is not more than the thickness of the semiconductor element. As the material for the resin base material 11, a resin material used in normal resin wiring substrates, such as glass epoxy resin, polyimide resin, polyester resin, and polyethylene terephthalate resin, can be used.

The connecting terminals 13, the wiring patterns 15 and 16, and the external connecting terminals 14 can be formed in predetermined shapes by, for example, processing copper foil into predetermined shapes using an exposing process and an etching process. Alternatively, these can be formed by printing a conductive paste, or by forming a thin conductor film using vapor deposition or sputtering and etching the thin conductor film.

The via conductors 17 and 18 can be formed by, for example, filling paste containing conductive components, such as gold powder and copper powder, and heat-curing the paste.

Although the case wherein the resin wiring substrate 10 has a multilayer structure as an example in the first embodiment, the resin wiring substrate 10 can also be of a double-sided wiring configuration. In this case, wiring patterns and via conductors in the internal layer are not required.

The thickness Ti of the first resin coating film 19 is within a range between 5 µm and 50 µm, preferably 20 µm. On the other hand, as mentioned above, the thickness T2 of the second resin coating film 20 is less than the thickness T1 of the first resin coating film 19. For example, when the thickness Ti of the first resin coating film 19 is 30 µm, the thickness T2 is preferably within a range between 10 µm and 25 µm.

By the above-described configuration, since the semiconductor element mounting portion of the resin wiring substrate 10 becomes flexibly deformable, when the semiconductor element is mounted, the resin wiring substrate 10 warps toward the semiconductor element side due to the thermal stress generated by difference in linear expansion coefficients between the resin base material 11 and the semiconductor element. Therefore, stress on the connecting portion between the resin wiring substrate 10 and the semiconductor element can be lowered by the warpage. Consequently, the occurrence of defects, such as poor connection at the connecting portion, breakdown of the vicinity of the corners of the resin wiring substrate side of the semiconductor element including inside of the semiconductor element, and the separation of the semiconductor element from the resin wiring substrate, can be suppressed, and the reliability of the semiconductor device can be improved.

Also by the contraction stress of the first resin coating film 19, warpage toward the semiconductor element side in the peripheral portion of the resin wiring substrate 10 can be reduced, and the occurrence of poor connection can be prevented when the semiconductor device using the resin wiring substrate 10 is mounted on a circuit board, such as a mother board. Consequently, the semiconductor device using the resin wiring substrate 10 can be reliably connected to a circuit board, such as a mother board.

Furthermore, according to such a configuration, the above-described effects can be obtained even when the first resin coating film 19 and the second resin coating film 20 are formed of the same material. The above-described effects can also be obtained even when the thickness of the resin base material 11 is not larger than the thickness of the semiconductor element mounted on the resin wiring substrate 10, leading to the thickness reduction of a semiconductor package.

Figure 4:
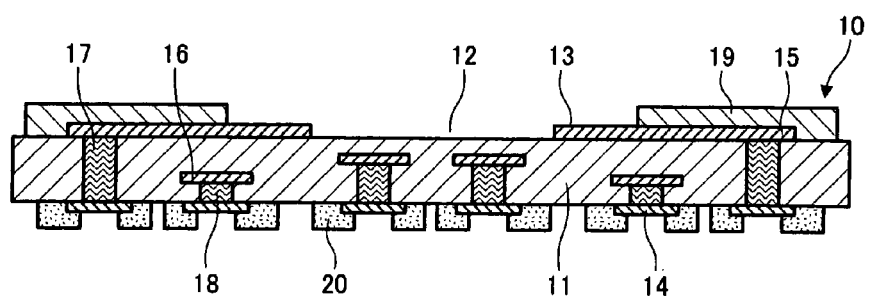
FIG. 4 is a schematic sectional view showing a part of a process for manufacturing a semiconductor device according to the first embodiment of the present invention.

Next, a process for manufacturing a semiconductor device of a BGA configuration using the resin wiring substrate 10 will be described referring to FIGS. 4 to 7. First, as shown in FIG. 4, the resin wiring substrate 10 is prepared.

The resin wiring substrate 10 can be fabricated, for example, as described hereunder. First, copper foils are adhered on both surfaces of the resin base material 11 wherein the wiring pattern 16 and the via conductor 18 are formed. The thickness of the resin base material 11 is, for example, within a range between 40 µm and 400 µm. The thickness of the resin base material 11 can be not larger than the semiconductor element mounted on the resin wiring substrate 10 fabricated using the resin base material 11. After adhering the copper foils, the via conductor 17, the connecting terminals 13, the wiring pattern 15 and the external connecting terminals 14 are formed.

The connecting terminals 13, the wiring pattern 15 and the external connecting terminals 14 can be formed by processing copper foils into predetermined shapes using an exposing process and an etching process, and performing gold plating and the like to required portions.

The via conductor 17 can be formed by drilling through-holes in the resin base material 11 using, for example, drilling method and laser radiation, and filling the through-holes with a plating conductor and the like. The plating conductor can be formed by depositing a single-layer configuration of copper (Cu), gold (Au) and the like: a double-layer configuration of copper (Cu)/nickel (Ni), a triple-layer configuration of gold (Au)/copper (Cu)/nickel (Ni), and the like having a thickness of 5 µm to 50 µm, preferably 20 µm in the through-holes using one of electrolytic plating and electroless plating. Alternatively, the plating conductor may be formed by filling the through-holes with a conductive paste.

As described above, after forming the connecting terminals 13, the wiring pattern 15, the external connecting terminals 14 and the like, the first resin coating film 19 and the second resin coating film 20 are formed. The first resin coating film 19 and the second resin coating film 20 may be formed using, for example, screen printing. Alternatively, the first resin coating film 19 and the second resin coating film 20 may be formed by applying a resin on the entire surface of the resin base material 11, and processing the resin into predetermined shapes using an exposing process and an etching process. For the first resin coating film 19, the use of screen printing is preferable. On the other hand, for the second resin coating film 20, the use of the exposing process and the etching process is preferable.

Figure 5:
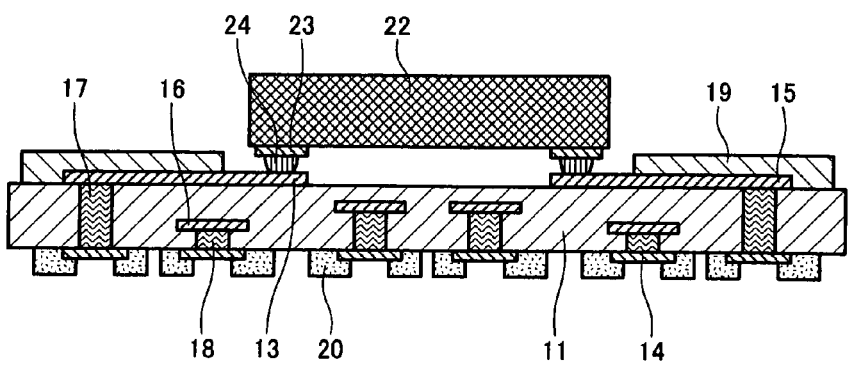
FIG. 5 is a schematic sectional view showing a part of a process for manufacturing the semiconductor device.

Next, as shown in FIG. 5, a semiconductor element 22 is mounted on the semiconductor element mounting region 12, and electrode terminals 23 are connected to the connecting terminals 13 via protruded electrodes 24 formed on the electrode terminals 23 of the semiconductor element 22. Specifically, a solder paste (not shown) is printed on a predetermined location on the connecting terminals 13 using, for example, a metal mask, and the protruded electrodes 24 are temporarily fixed on the solder paste. Thereafter, the resin wiring substrate 10 is heated using, for example, a reflow furnace, to melt the solder paste, and the electrode terminals 23 are electrically and mechanically connected via the protruded electrodes 24 and the solder paste to the connecting terminals 13. Although the heating temperature using the reflow furnace differs depending on the material of the solder paste used, for example, when a silver (Ag)-copper (Cu)-tin (Sn) solder paste is used, the temperature is set to about 240° C.

The method for connecting the electrode terminals 23 to the connecting terminals 13 is not limited to the above-described method. For example, the following method may be used as another method. Specifically, for example, a conductive resin paste containing a silver (Ag) filler may be applied on the protruded electrodes 24, and the applied conductive resin paste may be allowed to contact the connecting terminals 13 and heat-cured at a temperature in a range between 170° C. and 200° C. The method for connecting the connecting terminals 13 of the resin wiring substrate 10 to the electrode terminals 23 of the semiconductor element 22 is not specifically limited here.

Figure 6:
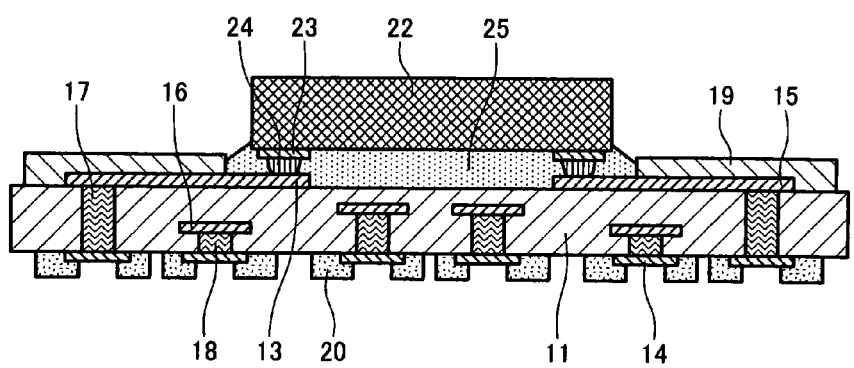
FIG. 6 is a schematic sectional view showing a part of a process for manufacturing the semiconductor device.

Next, as shown in FIG. 6, a resin 25 is formed in a gap between the resin base material 11 and the semiconductor element 22. Specifically, for example, the resin 25 is injected into the gap between the resin base material 11 and the semiconductor element 22, and is heat-cured. In this case, the resin 25 is a liquid resin consisting of an epoxy resin as the major component to which at least a light blocking pigment, a curing agent, and a cure-shrinkage controlling agent are added, and has a low viscosity enabling injection into the gap between the resin base material 11 and the semiconductor element 22. After injecting the liquid resin, the liquid resin is heat-cured at a temperature range between 160° C. and 210° C., preferably at a temperature of about 180° C. Alternatively, before mounting the semiconductor element 22, a non-conductive film is adhered on the semiconductor element mounted region 12 as a resin, and the resin 25 is formed using a method to penetrate the protruded electrodes 24 through the non-conductive film. The method for forming the resin is not specifically limited here.

Figure 7:
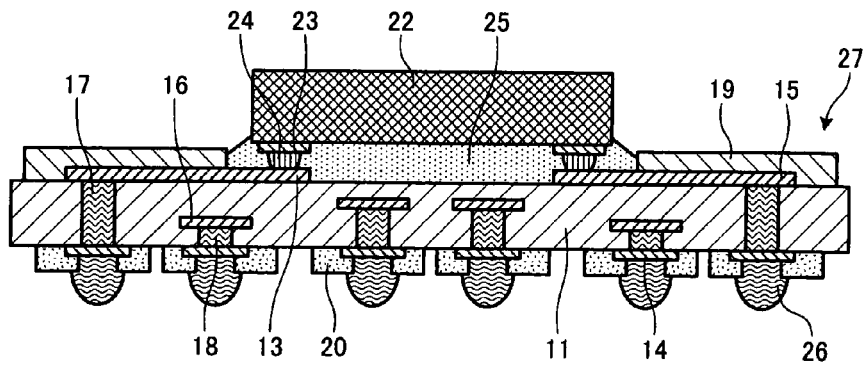
FIG. 7 is a schematic sectional view showing a part of a process for manufacturing the semiconductor device.

Finally, as shown in FIG. 7, after placing solder balls (protruded electrodes for connection) 26 consisting of, for example, a tin (Sn)-silver (Ag)-copper (Cu) alloy, on the external connecting terminals 14 formed on the other surface of the resin base material 11, the semiconductor device is heated to a temperature of about 240° C. to join the solder balls 26 to the external connecting terminals 14. Thereby, a semiconductor device 27 of a BGA configuration can be realized.

In the semiconductor device 27, when the semiconductor element 22 is mounted on the semiconductor element mounted region 12 of the resin wiring substrate 10, warpage caused by difference in the coefficients of thermal expansion between the resin base material 11 and the semiconductor element 22 occurs. By causing such warpage, stress acting on the connecting portion between the resin wiring substrate 10 and the semiconductor element 22, specifically, stress acting on the connecting portion between the protruded electrodes 24 and the connecting terminals 13, and stress acting on the connecting portion between the protruded electrodes 24 and electrode terminals 23 can be reduced. Therefore, the occurrence of defects, such as breakdown in the vicinity of corners in the resin wiring substrate side, and the separation of the semiconductor element from the resin wiring substrate can be prevented. As a result, in the resin wiring substrate having a high rigidity, stress caused by difference in the coefficients of thermal expansion between the resin base material and the semiconductor element acts on the connecting portion to cause poor connection. However, according to the first embodiment, warpage occurs in the semiconductor element mounted portion of the resin wiring substrate 10, and poor connection can be significantly suppressed.

On the other hand, since the first resin coating film 19 having larger thickness and larger area than the second resin coating film 20 is formed on the peripheral portion of the resin wiring substrate 10, warpage occurring in the resin wiring substrate 10 by mounting the semiconductor element 22 is reduced by the contracting stress of the first resin coating film 19. Therefore, a semiconductor device having entirely small warpage can be realized; the occurrence of poor connection in mounting the semiconductor device on a circuit board, such as a mother board, can be prevented; and the semiconductor device can be reliably connected to the circuit board.

Figure 8:
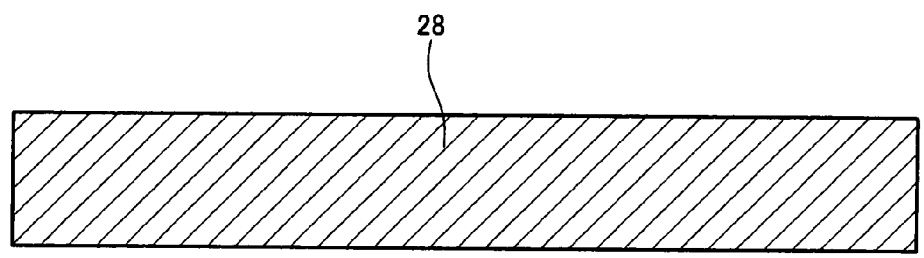
FIG. 8 is a process diagram for illustrating a problem in a semiconductor device using a resin wiring substrate having a much larger thickness and a higher rigidity than a semiconductor element.
Figure 9:
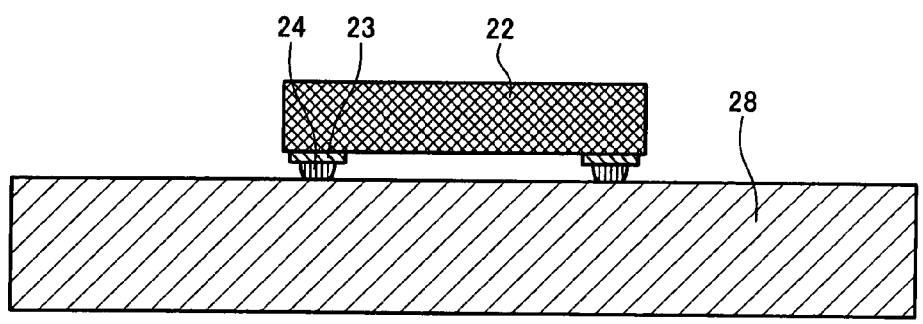
FIG. 9 is a process diagram for illustrating a problem in such a semiconductor device.
Figure 10:
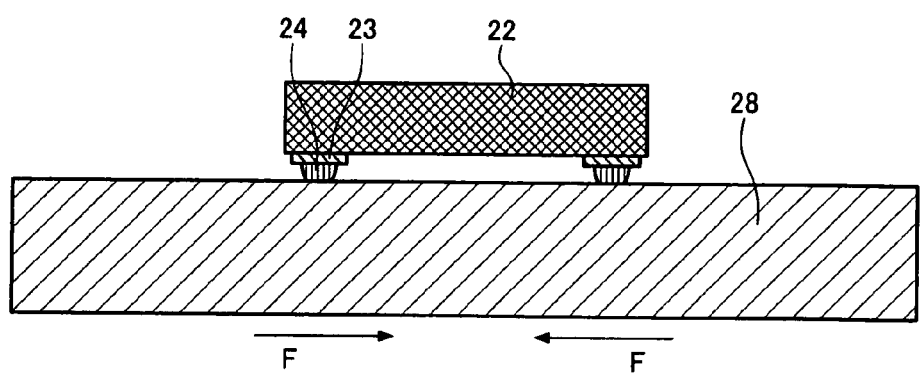
FIG. 10 is a process diagram for illustrating a problem in such a semiconductor device.
Figure 11:
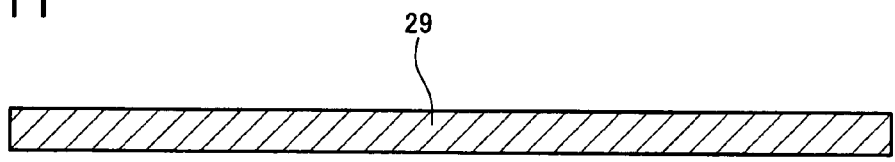
FIG. 11 is a process diagram for illustrating a problem in a semiconductor device using a wholly flexible resin wiring substrate.
Figure 12:
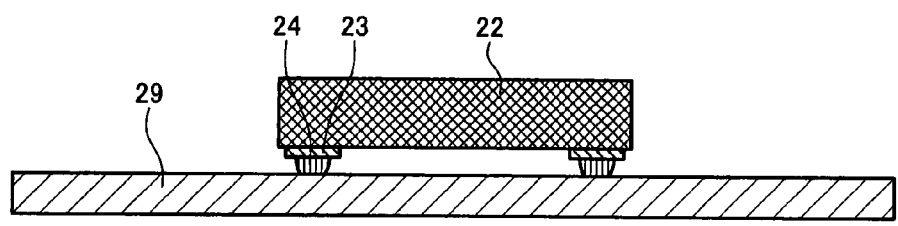
FIG. 12 is a process diagram for illustrating a problem in such a semiconductor device.
Figure 13:
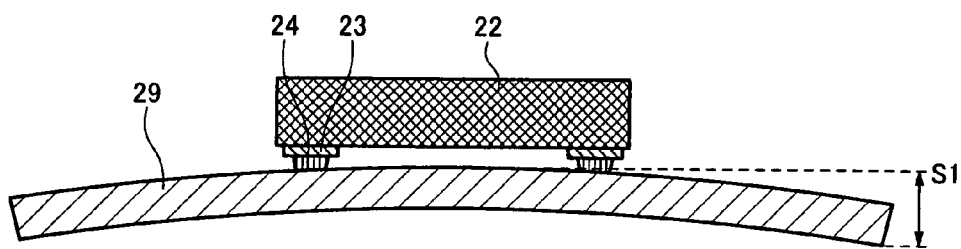
FIG. 13 is a process diagram for illustrating a problem in such a semiconductor device.
Figure 14:
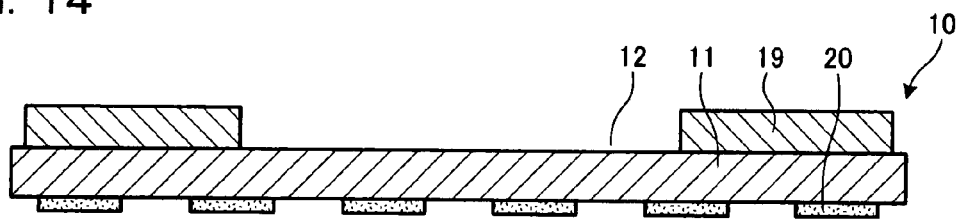
FIG. 14 is a process diagram for illustrating the mechanism for suppressing the poor connection and reducing warpage of the semiconductor device according to the first embodiment of the present invention.
Figure 15:
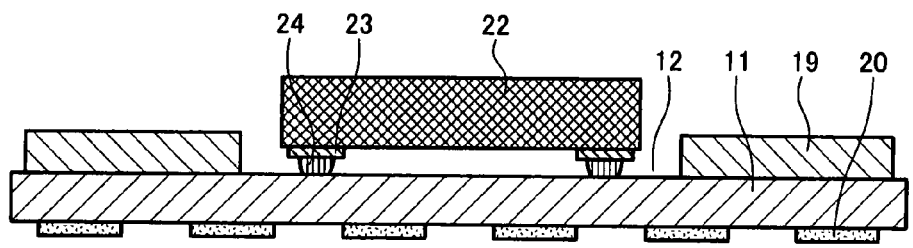
FIG. 15 is a process diagram for illustrating the mechanism for suppressing the poor connection and reducing warpage of the semiconductor device.
Figure 16:
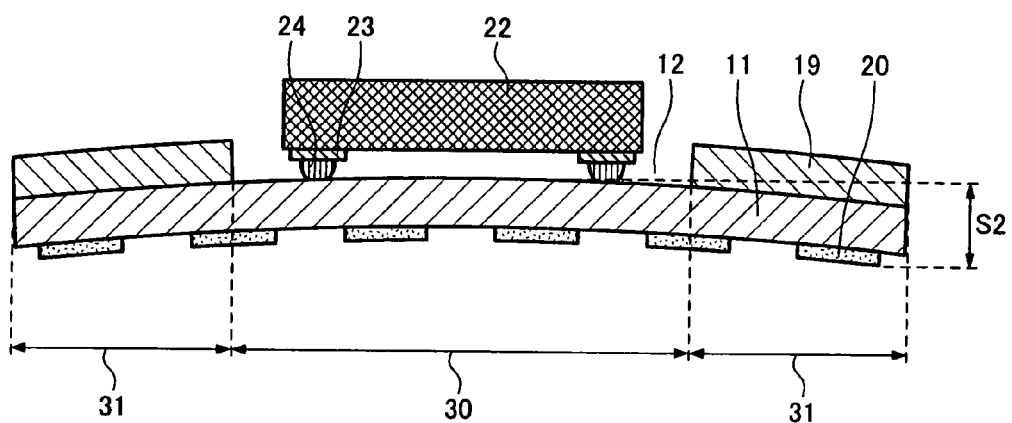
FIG. 16 is a process diagram for illustrating the mechanism for suppressing the poor connection and reducing warpage of the semiconductor device.

The mechanism of the suppression on poor connection and the reduction of warpage will be described hereunder referring to the schematic diagrams. Each of FIGS. 8 to 10 is a process diagram for illustrating a problem in a semiconductor device using a resin wiring substrate having a much larger thickness and a higher rigidity than a semiconductor element. Each of FIGS. 11 to 13 is a process diagram for illustrating a problem in a semiconductor device having a smaller thickness than the semiconductor element and a low rigidity, that is, wholly flexible resin wiring substrate. Each of FIGS. 14 to 16 is a process diagram for illustrating the mechanism for suppressing the poor connection and reducing warpage of the semiconductor device using the above-described resin wiring substrate 10. In these drawings, the structures are drawn in a simplified way, and the connecting terminals of the resin wiring substrate, the wiring pattern, the external connecting terminals, the via conductors, the resin, and solder balls are not shown in the drawings. Furthermore, in FIGS. 8 to 13, the first resin coating film and the second resin coating film are also not shown.

First, the case wherein a semiconductor device is manufactured using a resin wiring substrate having high rigidity will be described. Initially, as shown in FIG. 8, a resin wiring substrate 28 having high rigidity is prepared. Next, as shown in FIG. 9, the electrode terminals 23 of the semiconductor element 22 are aligned with the connecting terminals (not shown) of the resin wiring substrate 28. Then, as shown in FIG. 10, after carrying out heat treatment to connect the protruded electrodes 24 formed on the electrode terminals 23 of the semiconductor element 22 to the connecting terminals of the resin wiring substrate 28, a cooling treatment is carried out.

In this case, since the difference in coefficients of thermal expansion between the resin base material of the resin wiring substrate 28 and the semiconductor element 22 is large, the resin wiring substrate 28 shrinks in the directions shown by arrows F in FIG. 10 through the processes of heat treatment and cooling treatment. With this shrinkage, a large stress acts on the connecting portion of the protruded electrodes 24 to the connecting terminals of the resin wiring substrate 28, and the connecting portion of the protruded electrodes 24 to the electrode terminals 23. When this stress exceeds the connecting strength, poor connection in the connecting portion of the protruded electrodes 24 to the connecting terminals of the resin wiring substrate 28, poor connection in the connecting portion of the protruded electrodes 24 to the electrode terminals 23, or defects, such as breakdown in the vicinity of the corners of the semiconductor element in the resin wiring substrate side or the separation of the semiconductor element from the resin wiring substrate occurs. Therefore, although the warpage of the semiconductor device is reduced in this case, the reliability of connecting portions becomes difficult to secure.

On the other hand, when a semiconductor device is manufactured using a resin wiring substrate having low rigidity, first, as shown in FIG. 11, a resin wiring substrate 29 having low rigidity is prepared. Next, as shown in FIG. 12, the electrode terminals 23 of the semiconductor element 22 is aligned with the connecting terminals (not shown) of the resin wiring substrate 29. Then, as shown in FIG. 13, after carrying out heat treatment to connect the protruded electrodes 24 formed on the electrode terminals 23 of the semiconductor element 22 to the connecting terminals of the resin wiring substrate 29, a cooling treatment is carried out.

In this case, since the difference in coefficients of thermal expansion between the resin base material of the resin wiring substrate 29 and the semiconductor element 22 is large, the resin wiring substrate 29 shrinks through the processes of heat treatment and cooling treatment in the same manner as the resin wiring substrate 28 shown in FIG. 10. However, since the resin wiring substrate 29 has small rigidity unlike the resin wiring substrate 28 shown in FIGS. 8 to 10, warpage occurs in the resin wiring substrate 29 due to the shrinkage as shown in FIG. 13.

Specifically, since the protruded electrodes 24 are connected to the connecting terminals formed on the surface in the semiconductor element mounted side of the resin wiring substrate 29, the surface of the resin wiring substrate 29 opposite to the semiconductor element mounted side mainly shrinks, and warpage S1 convex toward the semiconductor element mounted side occurs in the resin wiring substrate 29 as shown in FIG. 13. The semiconductor device having such large warpage S1 is very difficult to be mounted on a circuit board, such as a mother board using solder balls and the like. However, by the occurrence of such warpage S1, stress acting on the connecting portion between the protruded electrodes 24 and the connecting terminals of the resin wiring substrate 29, and the connecting portion between the protruded electrodes 24 and the electrode terminals 23 is reduced.

When a semiconductor device is manufactured using the resin wiring substrate 10, first, as shown in FIG. 14, the resin wiring substrate 10 is prepared, and as shown in FIG. 15, the electrode terminals 23 of the semiconductor element 22 are aligned with the connecting terminals (not shown) of the resin wiring substrate 10. Next, as shown in FIG. 16, after carrying out heat treatment to connect the protruded electrodes 24 formed on the electrode terminals 23 of the semiconductor element 22 to the connecting terminals of the resin wiring substrate 10, a cooling treatment is carried out.

In this case, a semiconductor element mounted portion 30 of the resin wiring substrate 10 is easily shrunk and deformed. On the other hand, shrinkage stress of the first resin coating film 19 acts on peripheral portions 31. Specifically warpage convex toward the side where the semiconductor element 22 is mounted occurs in the semiconductor element mounted portion 30, and in the peripheral portions 31, the warpage is reduced by the first resin coating film 19. Therefore, warpage S2 on the entire semiconductor device 27 is significantly reduced compared with the warpage S1 shown in FIG. 13. As a result, stress acting on the connecting portion between the protruded electrodes 24 and the connecting terminals of the resin wiring substrate 10, and the connecting portion between the protruded electrodes 24 and the electrode terminals 23, or the vicinity of the corners of the semiconductor element 22 in the side of the resin wiring substrate 10 can be reduced while the warpage of the entire semiconductor device can also be reduced.

Although the case wherein the thickness of the semiconductor element is larger than the resin wiring substrate is described in the first embodiment, the present invention is not limited thereto. Since the rigidity of the substrate composing a semiconductor element, such as a silicon substrate, is larger than the rigidity of the resin wiring substrate, the same effects can be obtained even when the resin wiring substrate is thicker. As a measure, for example, the effect of the present invention can be obtained until the product of the Young's modulus and the thickness of the substrate composing the semiconductor element becomes nearly equal to the product of the Young's modulus and the thickness of the resin wiring substrate. For example, when a silicon substrate is used as the substrate for the semiconductor element, and a fiberglass-reinforced epoxy substrate is used as the resin wiring substrate, since the Young's moduli of the silicon substrate and the fiberglass-reinforced epoxy substrate in the [100] orientation are about 130 GPa and about 20 GPa, respectively, the effect of the present invention can be obtained until the thickness of the resin wiring substrate becomes about 6 times the thickness of the semiconductor element.

Figure 17:
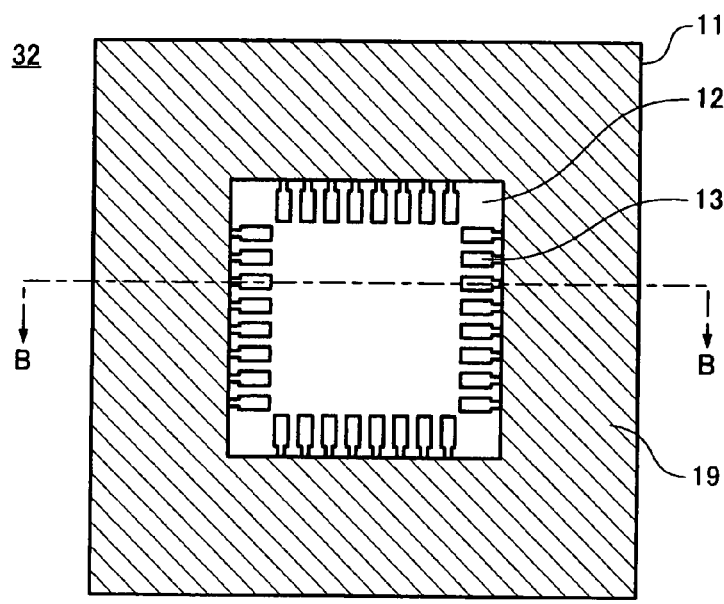
FIG. 17 is a schematic plan view of a first modification of the resin wiring substrate according to the first embodiment of the present invention viewed from the semiconductor element mounting side.
Figure 18:
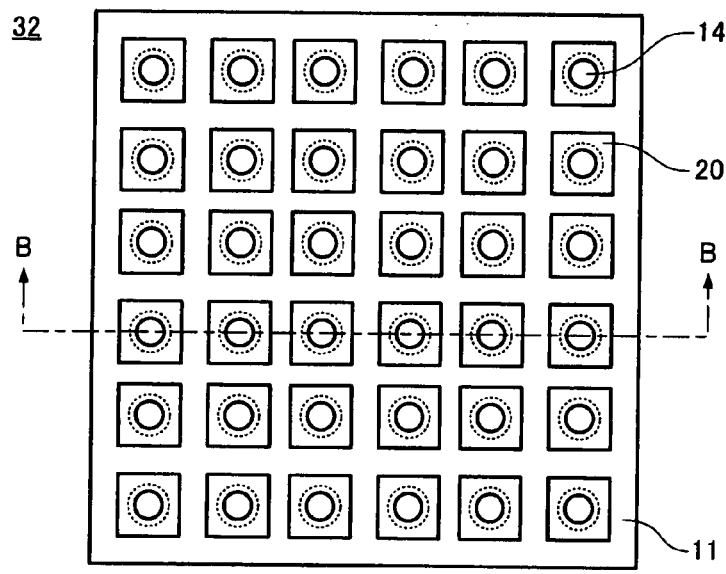
FIG. 18 is a schematic plan view of the resin wiring substrate viewed from the side opposite to the semiconductor element mounting side.
Figure 19:
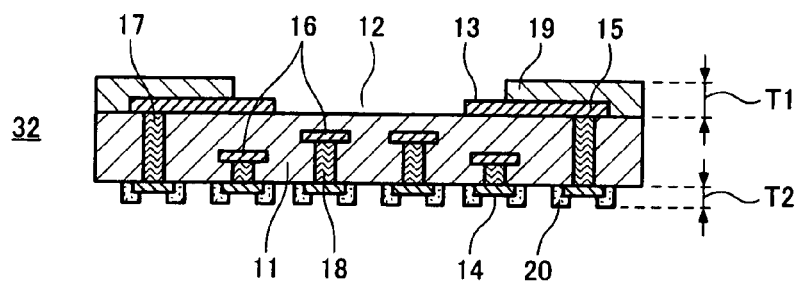
FIG. 19 is a schematic sectional view of the resin wiring substrate taken along line B-B shown in FIGS. 17 and 18.

Next, a modification of the resin wiring substrate will be described. FIG. 17 is a schematic plan view of a first modification of the resin wiring substrate according to the first embodiment of the present invention viewed from the semiconductor element mounting side; FIG. 18 is a schematic plan view of the resin wiring substrate viewed from the side opposite to the semiconductor element mounting side; and FIG. 19 is a schematic sectional view of the resin wiring substrate taken along line B-B shown in FIGS. 17 and 18.

The resin wiring substrate 32 is characterized in that the second resin coating film 20 on the other surface of the resin base material 11 (the plane in the opposite side to the semiconductor element mounted side) is formed so as to be separated for each of the external connecting terminals 14. Specifically, the second resin coating film 20 consists of 36 blocks separated between the external connecting terminals 14. However, the area of the second resin coating film 20 is smaller than the area of the first resin coating film 19. By thus forming the second resin coating film 20 so as to be separated, the effect of the stress of the second resin coating film 20 can be minimized.

When a semiconductor device is fabricated using the resin wiring substrate 32, in the same manner as in the semiconductor device 27 shown in FIG. 7 stress acting on the connecting portion between the semiconductor element and the resin wiring substrate, and the warpage of the semiconductor device can be reduced.

Figure 20:
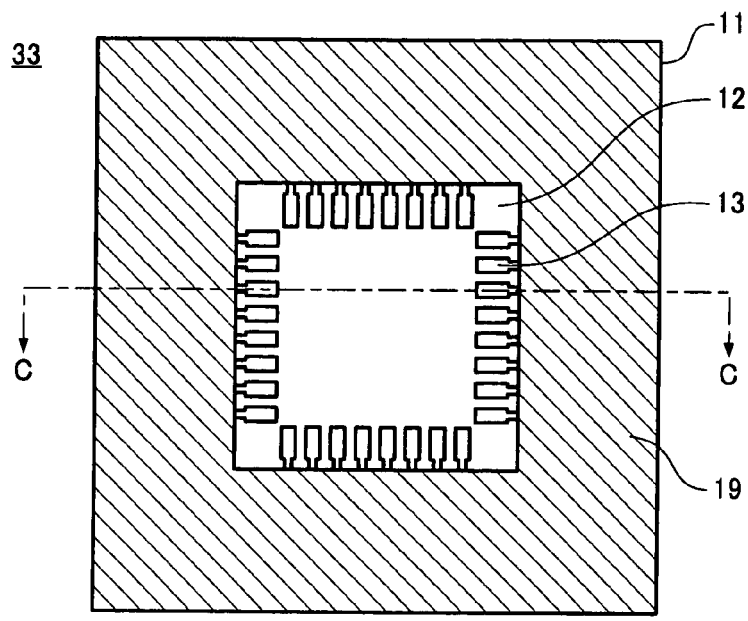
FIG. 20 is a schematic plan view of a second modification of the resin wiring substrate according to the first embodiment of the present invention viewed from the semiconductor element mounting side.
Figure 21:
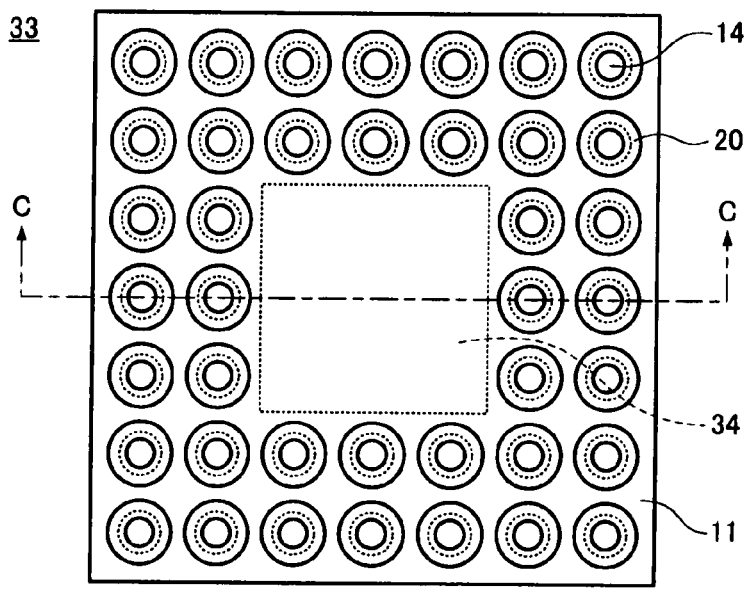
FIG. 21 is a schematic plan view of the resin wiring substrate viewed from the side opposite to the semiconductor element mounting side.
Figure 22:
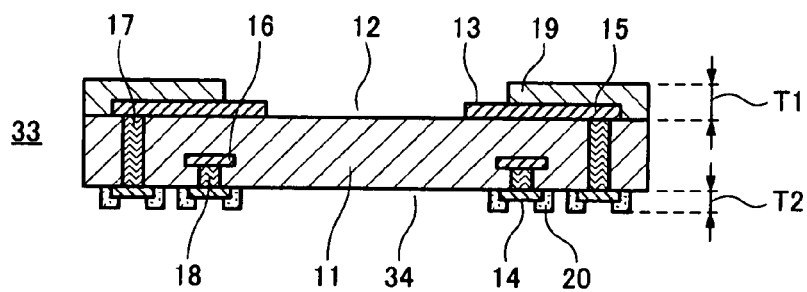
FIG. 22 is a schematic sectional view of the resin wiring substrate taken along line C-C shown in FIGS. 20 and 21.

FIG. 20 is a schematic plan view of a second modification of the resin wiring substrate according to the first embodiment of the present invention viewed from the semiconductor element mounting side; FIG. 21 is a schematic plan view of the resin wiring substrate viewed from the side opposite to the semiconductor element mounting side; and FIG. 22 is a schematic sectional view of the resin wiring substrate taken along line C-C shown in FIGS. 20 and 21.

The resin wiring substrate 33 is characterized in that the external connecting terminals 14 and the second resin coating film 20 are not formed in a region 34 corresponding to the semiconductor element mounted region 12 on the other surface of the resin base material 11 (the plane in the opposite side to the semiconductor element mounted side) (corresponding region). Specifically, in the resin wiring substrate 33 neither the first resin coating film 19 nor the second resin coating film 20 is formed on the semiconductor element mounted portion.

By forming the resin wiring substrate 33 in such a configuration, the semiconductor element mounted portion can be more flexible. On the other hand, since the first resin coating film 19 having larger thickness and larger area than the second resin coating film 20 is formed in the peripheral portion, the warpage of the resin wiring substrate 33 can be reduced by the shrinkage stress of the first resin coating film 19. Furthermore, since the external connecting terminals 14 are disposed only in the little warped peripheral portion, and not disposed on the semiconductor element mounted region where warpage remains, poor connection when the semiconductor device is mounted on a circuit board, such as a mother board, can be further reduced.

When a semiconductor device is fabricated using the resin wiring substrate 33, in the same manner as in the semiconductor device 27 shown in FIG. 7, stress acting on the connecting portion of the semiconductor element to the resin wiring substrate can be reduced, and the warpage of the semiconductor device can also be reduced.

Although the shape of the region wherein no external connecting terminals are disposed is substantially the same shape as the semiconductor element mounted region 12 in the second modification, the shape of the region wherein no external connecting terminals are disposed is not limited to the same shape as the semiconductor element mounted region 12, but for example, a circular region may be formed in the center portion of the resin base material 11 as the shape of the region wherein no external connecting terminals are disposed. As another modification, the external connecting terminals may be disposed in the corresponding region 34 in a coarser pitch than in the peripheral portion.

Although the shape of the second resin coating film 20 viewed from the above is circular in the above-described first and second modifications, the shape may be square and the like, and is not specifically limited.

In the first embodiment, although examples wherein the second resin coating film is separated into 9 blocks, and is separated for each of external connecting terminals are described, respectively, the separating patterns of the second resin coating film are not limited thereto.

Figure 23:
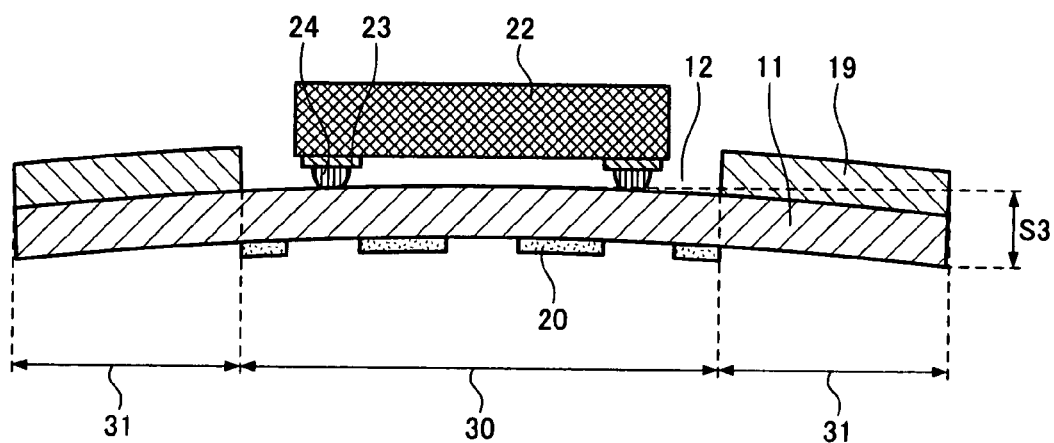
FIG. 23 is a diagram for illustrating another modification of the resin wiring substrate according to the first embodiment of the present invention.

As another example of modification, as shown in FIG. 23, unlike the second modification, the external connecting terminals (not shown) and the second resin coating film 20 may be formed only on the semiconductor element mounted portion 30. By such a configuration, since only the first resin coating film 19 is formed in a peripheral portion 31, the warpage reducing effect by the first resin coating film 19 is enhanced, and warpage S3 of the entire resin wiring substrate (semiconductor device) is improved. In addition, since the external connecting terminals are formed only on the semiconductor element mounted portion 30, the fluctuation of the warpage of external connecting terminals (coplanarity) is improved compared with the case wherein the external connecting terminals are disposed on the entire surface opposite to the semiconductor element mounted side of the resin base material 11.

FIG. 23 shows a simplified configuration, and the connecting terminals, wiring patterns, external connecting terminals, via conductors, resin, and solder balls of the resin wiring substrate are not shown.

Second Embodiment

Figure 24:
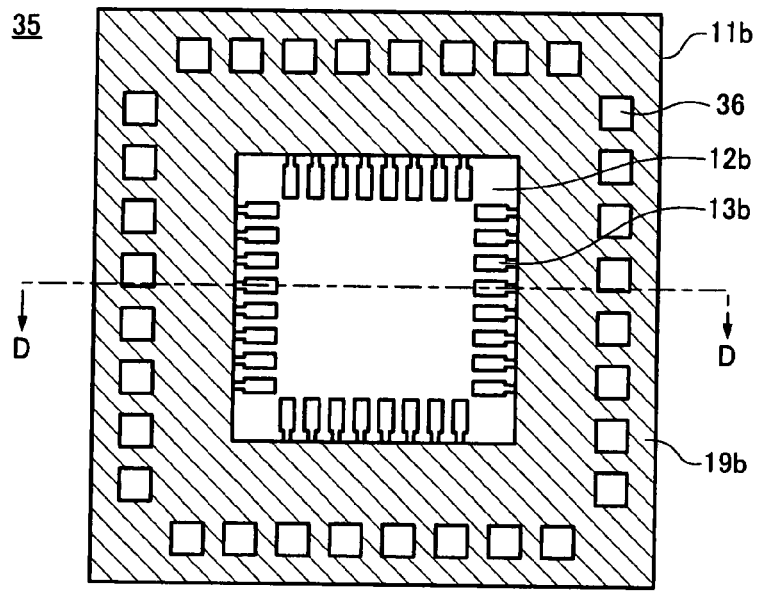
FIG. 24 is a schematic plan view of a resin wiring substrate to be laminated according to a second embodiment of the present invention viewed from a semiconductor element mounting side.
Figure 25:
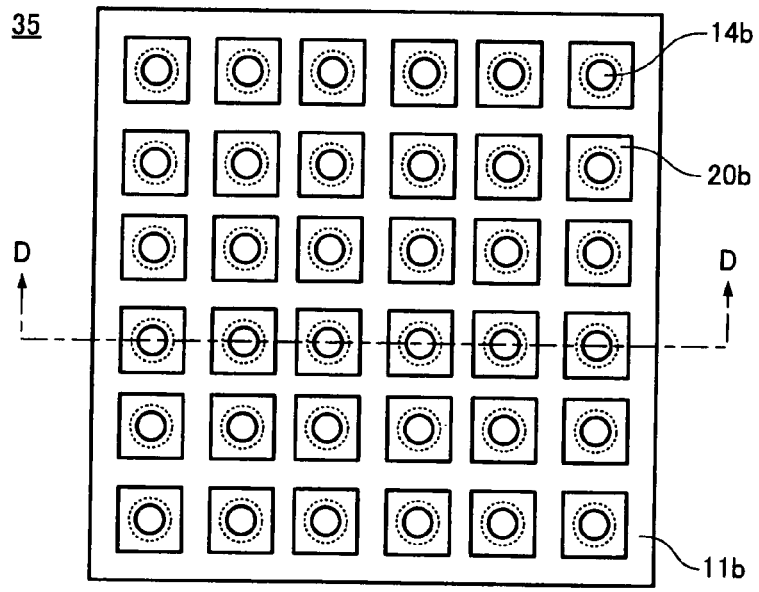
FIG. 25 is a schematic plan view of the resin wiring substrate viewed from the side opposite to the semiconductor element mounting side.
Figure 26:
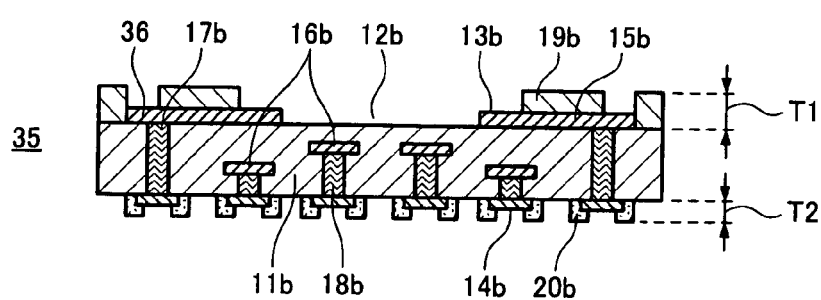
FIG. 26 is a schematic sectional view of the resin wiring substrate taken along line D-D shown in FIGS. 24 and 25.
Figure 27:
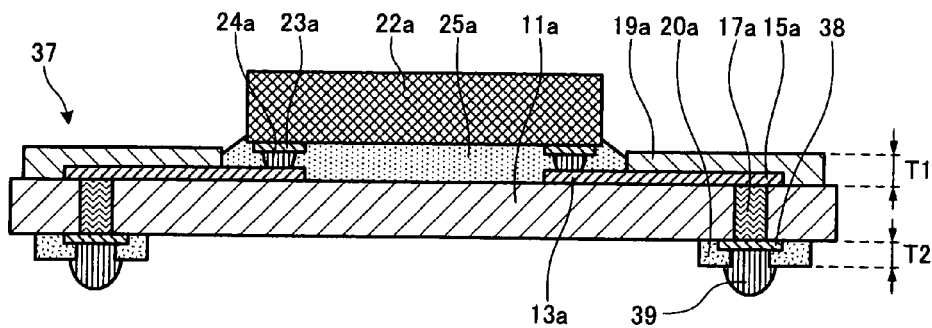
FIG. 27 is a schematic sectional view showing the configuration of a semiconductor device for lamination according to the second embodiment of the present invention.
Figure 28:
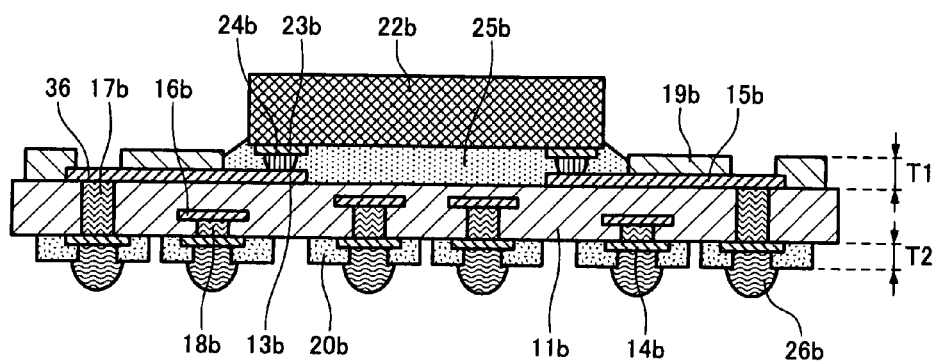
FIG. 28 is a schematic sectional view showing the configuration of a semiconductor device to be laminated according to the second embodiment of the present invention.
Figure 29:
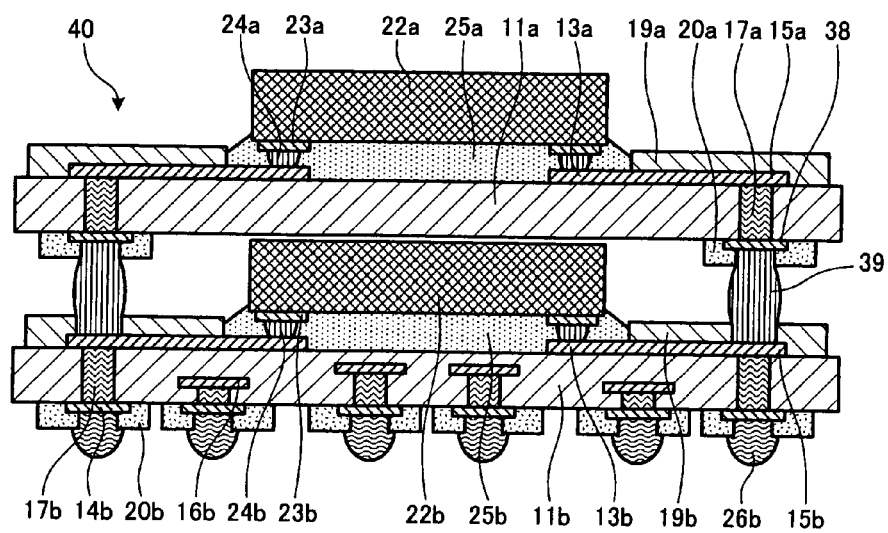
FIG. 29 is a schematic sectional view showing the configuration of a laminated semiconductor device according to the second embodiment of the present invention.

FIG. 24 is a schematic plan view of a resin wiring substrate to be laminated according to the second embodiment of the present invention viewed from a semiconductor element mounting side; FIG. 25 is a schematic plan view of the resin wiring substrate viewed from the side opposite to the semiconductor element mounting side; FIG. 26 is a schematic sectional view of the resin wiring substrate taken along line D-D shown in FIGS. 24 and 25; FIG. 27 is a schematic sectional view showing the configuration of a semiconductor device for lamination that constitutes a semiconductor device having a laminate configuration (laminated semiconductor device) according to the second embodiment of the present invention; and FIG. 28 is a schematic sectional view showing the configuration of a semiconductor device to be laminated that constitutes the laminated semiconductor device. FIG. 29 is a schematic sectional view showing the configuration of the laminated semiconductor device, and shows a configuration wherein the semiconductor device for lamination shown in FIG. 27 is laminated on the semiconductor device to be laminated shown in FIG. 28.

The semiconductor device according to the second embodiment has a configuration shown in FIG. 29. Members same as the members used in the above-described first embodiment will be denoted by the same symbols to which suffixes a and b are added, and detailed description thereof will be omitted.

First, the configuration of a resin wiring substrate 35 to be laminated according to the second embodiment will be described referring to FIGS. 24 to 26. The general configuration of the resin wiring substrate 35 is identical to the resin wiring substrate 32 shown in FIGS. 17 to 19, but is different in the following aspects. Specifically, the resin wiring substrate 35 is different from the resin wiring substrate 32 shown in FIGS. 17 to 19 in that connecting terminals for lamination 36 for connecting to the semiconductor device for lamination are formed in the external region of a surface of a resin base material 1ib (surface on the semiconductor element mounted side), and a first resin coating film 19b is formed to have a shape to expose at least a part of each of the connecting terminals for lamination 36. Also since the connecting terminals for lamination 36 are added, the shape of a wiring pattern 15b formed on the surface of the resin base material 1ib, and the locations of an inner-layer wiring pattern 16b and via conductors 17b and 18b are also different. However, in FIGS. 24 to 26, for the convenience of illustration, the pattern shape and locations are shown as the same pattern shape and locations shown in FIGS. 17 to 19.

Since the resin wiring substrate 35 is different from the resin wiring substrate 32 shown in FIGS. 17 to 19 in the above-described aspects, and other aspects are the same, the description for the same aspects will be omitted. Although the resin wiring substrate 35 similar to the resin wiring substrate 32 shown in FIGS. 17 to 19 is used for description here, the resin wiring substrate is not limited thereto, but a resin wiring substrate having the same general configuration as the resin wiring substrate described in the first embodiment may also be used.

Since a manufacturing process of the resin wiring substrate 35 is the same as the process described in the first embodiment, the description thereof will be omitted. The connecting terminals for lamination 36 can be formed in the same manner as connecting terminals 13b. The first resin coating film 19b is preferably formed by a method using an exposing process and an etching process.

Since the semiconductor device to be laminated shown in FIG. 28 is a semiconductor device wherein a semiconductor element 22b is mounted on the resin wiring substrate 35, and a manufacturing process thereof is the same as the process described in the first embodiment, the description thereof will be omitted.

Next, a semiconductor device for lamination will be described. The semiconductor device for lamination is a resin wiring substrate for lamination (lamination substrate) on which a semiconductor element is mounted, and the lamination substrate has the same general configuration as the resin wiring substrate described in the first embodiment.

Specifically, as shown in FIG. 27, the lamination substrate 37 has a semiconductor element mounted region, the connecting terminals 13a, and the wiring pattern 15a formed on the surface of the resin base material 11a (surface on the semiconductor element mounted side) in the same manner as in the resin wiring substrate described in the first embodiment. On the other surface of the resin base material 11a (surface opposite to the semiconductor element mounted side), inter-substrate connecting terminals 38 are formed in an arrangement corresponding to the connecting terminals for lamination 36 formed on the surface of the resin wiring substrate to be laminated 35 (surface on the semiconductor element mounted side). In the same manner as in the first embodiment, the via conductor 17a is formed in the resin base material 11a, and the wiring pattern 15a and the via conductor 17a connect the connecting terminals 13a to the inter-substrate connecting terminals 38.

Also in the same manner as in the first embodiment, a first resin coating film 19a is continuously formed in a region excluding the semiconductor element mounted region (external region) on the surface of the resin base material 11a. On the other surface of the resin base material 11a, a second resin coating film 20a is formed in a shape for exposing a part of each of the inter-substrate connecting terminals 38.

In the same manner as in the first embodiment, the first resin coating film 19a and the second resin coating film 20a consist of a solder resist. The thickness of the resin base material 11a is not more than the thickness of a semiconductor element 22a to be mounted on the lamination substrate 37.

Also in the same manner as in the first embodiment, the first resin coating film 19a is formed so that the thickness T1 thereof is larger than the thickness T2 of the second resin coating film 20a. The second resin coating film 20a is formed so that the total area thereof is smaller than the area of the first resin coating film 19a.

By thus continuously forming in the external region of the resin base material 11a the first resin coating film 19a so that the thickness Ti thereof is larger than the thickness T2 of the second resin coating film 20a, and by making the area of the second resin coating film 20a smaller than the area of the first resin coating film 19a, in the same manner as in the first embodiment, the semiconductor element mounted portion of the lamination substrate 37 can be made to be deformable. At the same time, the warpage of the lamination substrate 37 can be reduced by the first resin coating film 19a formed in the external region of the resin base material 11a. Also in the same manner as in the first embodiment, by forming the second resin coating film 20a so as to be separated, the effect of the stress of the second resin coating film 20a can be further reduced.

The lamination substrate 37 can be formed by the same manufacturing method as the method for manufacturing the resin wiring substrate described in the first embodiment. The semiconductor device for lamination using the lamination substrate 37 can also be formed by the same manufacturing method as the method for manufacturing the semiconductor device described in the first embodiment.

For example, first copper foils are adhered on both surfaces of the resin base material 11a, and through holes are formed in the resin base material 11a by drilling and the like. Then, the through holes are filled with plated conductors and the like to form the via conductor 17a. Next, the copper foils are processed into predetermined shapes by the exposing process and the etching process, and the connecting terminals 13a, the wiring pattern 15a, and the inter-substrate connecting terminals 38 are formed by performing gold plating and the like on required places. Thereafter, the first resin coating film 19a and the second resin coating film 20a are formed.

The lamination substrate 37 fabricated as described above is prepared, the semiconductor element 22a is mounted on the semiconductor element mounting region of the lamination substrate 37, and via protruded electrode 24a formed on electrode terminals 23a of the semiconductor element 22a, the electrode terminals 23a are connected to the connecting terminals 13a.

Next, a resin 25a is injected into the gap between the resin base material 11a and the semiconductor element 22a, and is heat-cured. Finally, after placing spherical protruded electrodes for lamination 39 formed, for example, of a tin (Sn)-silver (Ag)-copper (Cu) alloy on the inter-substrate connecting terminals 38 formed on the other surface of the resin base material 11a, heat treatment is performed at a temperature of about 240° C. to join the protruded electrodes for lamination 39 with the inter-substrate connecting terminals 38.

As shown in FIG. 29, a semiconductor device 40 having a laminated configuration (laminated semiconductor device) can be fabricated by mounting a semiconductor device for lamination constituted using the lamination substrate 37 on a semiconductor device to be laminated constituted using the resin wiring substrate 35, and connecting the connecting terminals for lamination 36 to the inter-substrate connecting terminals 38 via protruded electrodes for lamination 39.

Next, the mechanism for the suppression of poor connection and the reduction of warpage in the laminated semiconductor device 40 will be described referring to schematic diagrams shown in FIGS. 30 to 32. In these diagrams, configurations are drawn in a simplified manner, and the connecting terminals, the wiring patterns, the via conductors, the resin and the like are not shown.

Figure 30:
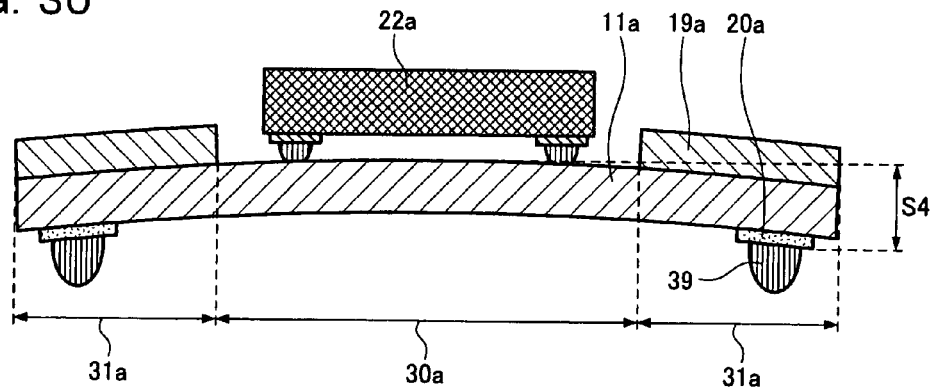
FIG. 30 is a diagram for illustrating the mechanism for suppressing the poor connection and reducing warpage in the semiconductor device.

In the semiconductor device for lamination shown in FIG. 30, since the semiconductor element mounted portion 30a of the resin base material 11a is easily shrunk and deformed as in the first embodiment, and the shrinkage stress of the first resin coating film 19a acts on the peripheral portion 31a of the lamination substrate 37, by the warpage of the semiconductor element mounted portion 30a, stress acting on the connecting portion between the lamination substrate 37 and the semiconductor element 22a is reduced, and warpage S4 of the entire semiconductor device is reduced.

Figure 31:
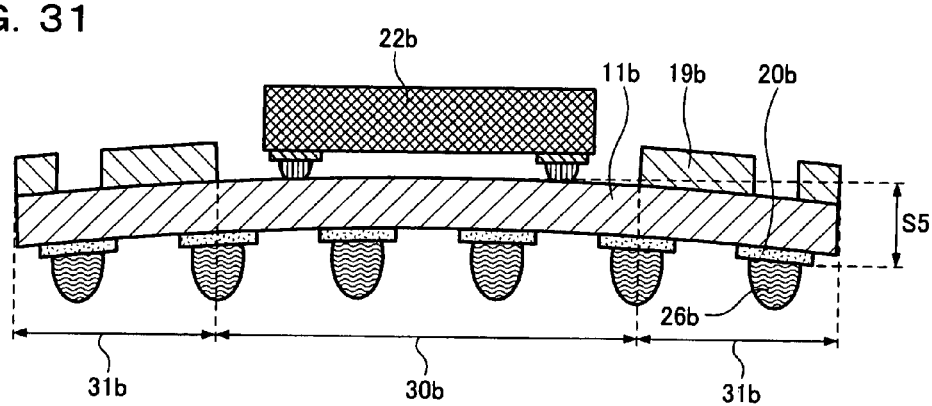
FIG. 31 is a diagram for illustrating the mechanism for suppressing the poor connection and reducing warpage in the semiconductor device.

Also in a semiconductor device to be laminated shown in FIG. 31, in the same manner as in the first embodiment, by the warpage of a semiconductor element mounted portion 30b, stress acting on the connecting portion between the resin wiring substrate 35 and a semiconductor element 22b is reduced, and warpage S5 of the entire semiconductor device is reduced.

Figure 32:
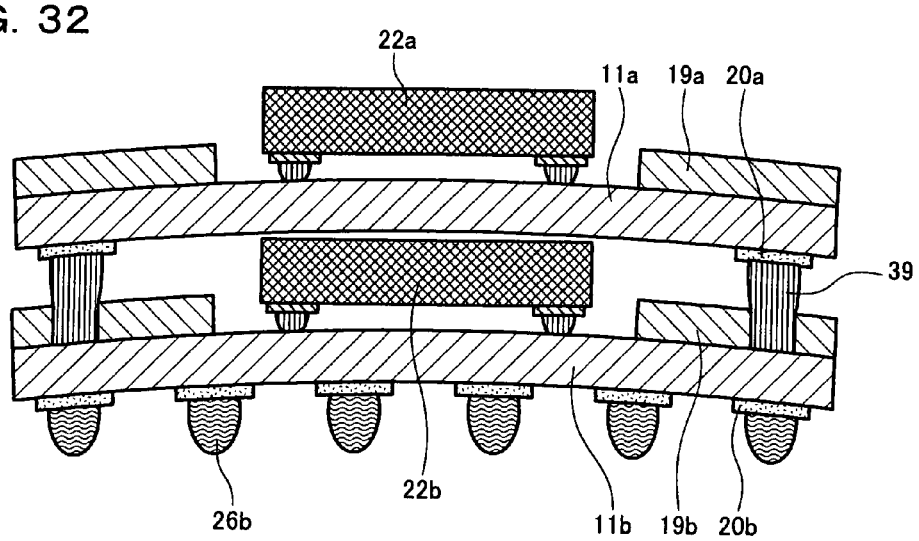
FIG. 32 is a diagram for illustrating the mechanism for suppressing the poor connection and reducing warpage in the semiconductor device.

Therefore, poor connection when the semiconductor device for lamination shown in FIG. 30 is connected and integrated with the semiconductor device to be laminated shown in FIG. 31 by the protruded electrodes for lamination 39 as shown in FIG. 32 is difficult to occur, and the semiconductor device for lamination can be stably connected to the semiconductor device to be laminated. Although thin resin base materials 11a and 11b are used, the warpage of the entire semiconductor device having a laminated and integrated structure can be minimized, and the laminated semiconductor device can be properly mounted on a circuit board, such as a mother board.

Next, a modification of the laminated semiconductor device will be described.

Figure 33:
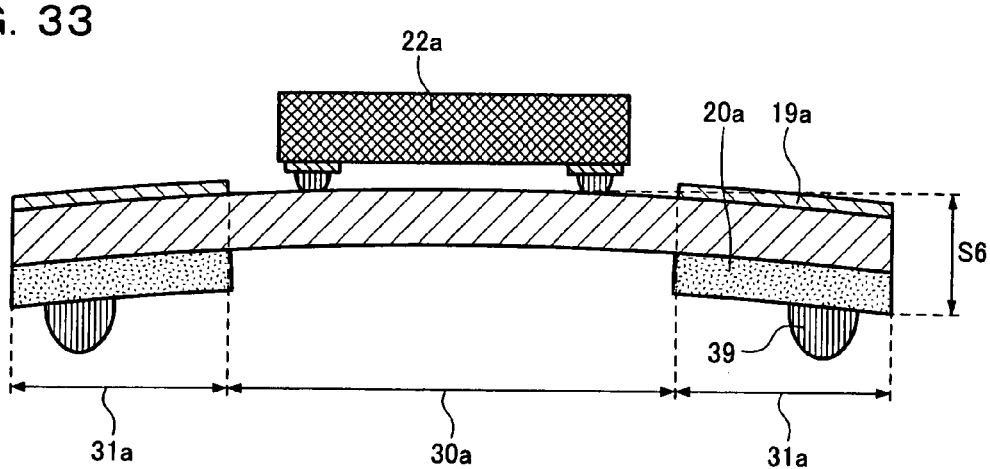
FIG. 33 is a diagram for illustrating the configuration of a laminated semiconductor device constituting a modification of the laminated semiconductor device according to the second embodiment of the present invention.
Figure 34:
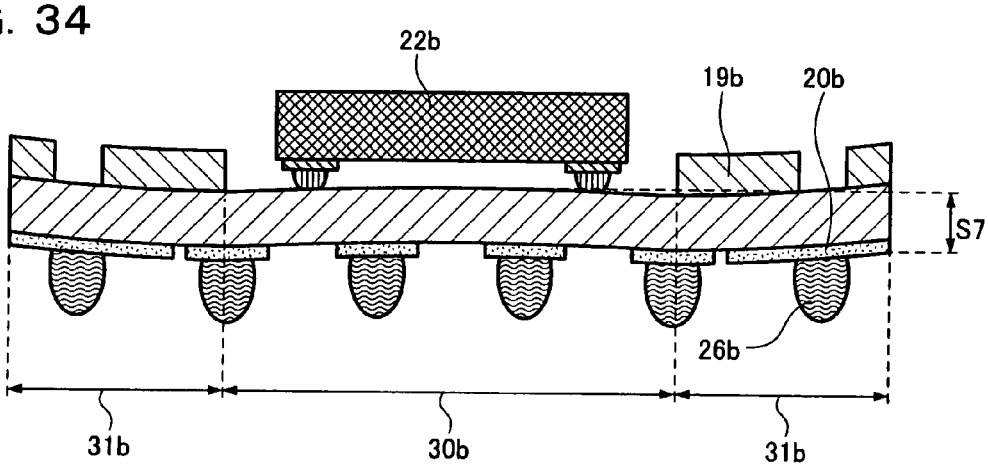
FIG. 34 is a diagram for illustrating the configuration of a semiconductor device to be laminated constituting the laminated semiconductor device.
Figure 35:
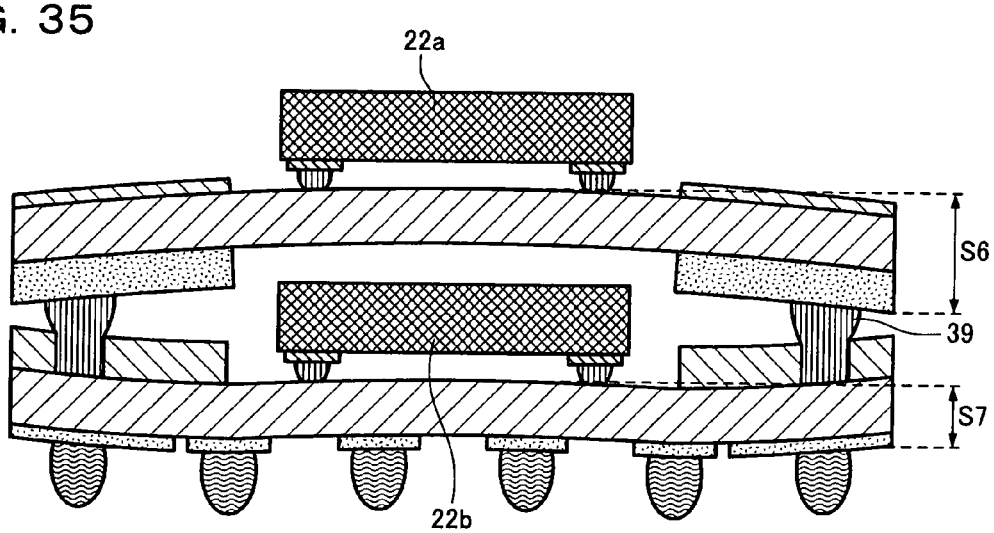
FIG. 35 is a diagram for illustrating the configuration of such a semiconductor device.

FIG. 33 is a schematic sectional diagram for illustrating the configuration of a laminated semiconductor device constituting a modification of the semiconductor device having a laminated structure (laminated semiconductor device) according to the second embodiment of the present invention;

and FIG. 34 is a diagram for illustrating the configuration of a semiconductor device to be laminated constituting the laminated semiconductor device. FIG. 35 is a schematic sectional diagram for illustrating the configuration of such a semiconductor device, and shows a semiconductor device having a configuration wherein the semiconductor device for lamination shown in FIG. 33 is laminated on the semiconductor device to be laminated shown in FIG. 34. This modification has a configuration shown in FIG. 35. In these diagrams, configurations are drawn in a simplified manner, and the connecting terminals, the wiring patterns, the via conductors, the resin and the like are not shown.

The semiconductor device for lamination shown in FIG. 33 is different from the semiconductor device for lamination shown in FIG. 30 in that the thickness of the first resin coating film 19a is smaller than the thickness of the second resin coating film 20a. Specifically, the semiconductor device for lamination is characterized in that the warpage of the entire semiconductor device for lamination is increased by raising the stress of the second resin coating film 20a. Although not illustrated in the drawing, increasing the thickness of the second resin coating film 20a to be larger than the thickness of the semiconductor element 22a is quite effective. To raise the stress of the second resin coating film 20a to be larger than the stress of the first resin coating film 19a, the second resin coating film 20a may be continuously formed, or the area of the second resin coating film 20a may be enlarged. On the contrary, the first resin coating film 19a may be separated, or the area of the first resin coating film 19a may be reduced. However, since the rigidity of the semiconductor element mounted portion 30a must be reduced in order to prevent the occurrence of poor connection in the connecting portion between the lamination substrate and the semiconductor element 22a, for example, neither the first resin coating film 19a nor the second resin coating film 20a is formed in the semiconductor element mounted portion 30a, as shown in FIG. 33.

On the other hand, the semiconductor device to be laminated shown in FIG. 34 is different from the semiconductor device to be laminated shown in FIG. 31 in that the warpage of the peripheral portion 31 is made to be in the opposite direction to the warpage of the semiconductor element mounted portion 30b, by making the first resin coating film 19b significantly thick, and making the stress of the first resin coating film 19b significantly larger than the stress of the second resin coating film 20b. Although not illustrated in the drawing, increasing the thickness of the first resin coating film 19b to be larger than the thickness of the semiconductor element 22b is quite effective.

When the semiconductor device for lamination and the semiconductor device to be laminated having the above-described configurations are laminated, as shown in FIG. 35, since the distance between the semiconductor device for lamination and the semiconductor device to be laminated is narrowed in the vicinities of protruded electrodes 39, and the length of the protruded electrodes 39 can be reduced, poor connection between the connecting terminals for lamination and the inter-substrate connecting terminals can be prevented.

The resin wiring substrate and the semiconductor device and the laminated semiconductor device using the resin wiring substrate according to the present invention can suppress the warpage of various semiconductor devices including semiconductor devices having laminated structures while using a thin resin wiring substrate; can improve the reliability of mounting semiconductor devices on a circuit board, such as a mother board; and are useful in the fields of electronic equipment that require the reduction in size and thickness in mobile phones and the like.

What is claimed is:

1. A resin wiring substrate at least comprising:
a resin base material,
a plurality of connecting terminals formed in a semiconductor element mounting region on a surface of the resin base material,
a plurality of external connecting terminals formed on the other surface of the resin base material,
a first resin coating film formed in an external region excluding the semiconductor element mounting region on the surface of the resin base material, and
a second resin coating film formed on the other surface in a shape exposing at least a part of each of the external connecting terminals; wherein
the second resin coating film comprises a plurality of separate portions on the other surface of the resin base material and at least two of the external connecting terminals are exposed from each of the separate portions of the second resin coating film,
an opening is formed in a center portion of each of the separate portions of the second resin coating film and the other surface of the resin base material is exposed through each of the openings and between adjacent separate portions of the second resin coating film.

2. The resin wiring substrate according to claim 1, wherein the first resin coating film and the second resin coating film are composed of the same material.

3. The resin wiring substrate according to claim 2, wherein the first resin coating film and the second resin coating film are composed of a solder resist.

4. The resin wiring substrate according to claim 1, wherein a thickness of the resin base material is less than or equal to a thickness of a semiconductor element mounted on the resin base material.

5. The resin wiring substrate according to claim 1, wherein the external connecting terminals and the second resin coating film are mainly formed in a region excluding a region corresponding to the semiconductor element mounting region on the other surface.

6. The resin wiring substrate according to claim 1, wherein the external connecting terminals and the second resin coating film are formed only in a region corresponding to the semiconductor element mounting region on the other surface.

7. The resin wiring substrate according to claim 1, further comprising a plurality of connecting terminals for lamination provided in the external region of the surface, wherein the first resin coating film is formed in a shape exposing at least a part of each of the connecting terminals for lamination.

8. A semiconductor device at least comprising the resin wiring substrate according to claim 1, a semiconductor element mounted in the semiconductor element mounting region of the resin wiring substrate, and a protruding electrode for connection on each of the external connecting terminals of the resin wiring substrate.

9. A laminated semiconductor device comprising:
a first semiconductor device comprising:
a laminated substrate comprising:
a resin base material,
a plurality of connecting terminals formed in a semiconductor element mounting region on a surface of the resin base material,
a plurality of inter-substrate connecting terminals formed on the other surface of the resin base material,
a first resin coating film formed in an external region excluding the semiconductor element mounting region on the surface of the resin base material, and a second resin coating film formed on the other surface in a shape exposing at least a part of each of the inter-substrate connecting terminals, wherein the first resin coating film has a larger thickness and a larger area than the second resin coating film, and is continuous; and the second resin coating film comprises a plurality of separate portions on the other surface of the resin base material; and the other surface of the resin base material is exposed between adjacent separate portions of the second resin coating film;

a semiconductor element mounted in the semiconductor element mounting region of the laminated substrate, and a protruding electrode for lamination on each of the inter-substrate connecting terminals of the laminated substrate; and a second semiconductor device comprising:

a resin wiring substrate according to claim 1 further comprising a plurality of connecting terminals for lamination in the external region on the surface, wherein the first resin coating film is in a shape exposing at least a part of each of the connecting terminals for lamination;

a second semiconductor element mounted in the semiconductor element mounting region of the resin wiring substrate; and protruding electrodes for connection on each of the external connecting terminals of the resin wiring substrate, wherein the inter-substrate connecting terminals of the first semiconductor device are located corresponding to the connecting terminals for lamination of the second semiconductor device, and the connecting terminals for lamination of the second semiconductor device are connected to the inter-substrate connecting terminals of the first semiconductor device via the protruding electrodes for lamination.

10. The laminated semiconductor device according to claim 9, wherein the first resin coating film and the second resin coating film of the first semiconductor device are composed of the same material.

11. The laminated semiconductor device according to claim 10, wherein the first resin coating film and the second resin coating film of the first semiconductor device are composed of a solder resist.

12. The laminated semiconductor device according to claim 9, wherein a thickness of the resin base material of the first semiconductor device is less than or equal to a thickness of the semiconductor element mounted on the first semiconductor device.

13. The laminated semiconductor device according to claim 9, wherein the inter-substrate connecting terminals and the second resin coating film of the first semiconductor device are formed only in a region excluding a region corresponding to the semiconductor element mounting region on the other surface of the resin base material of the first semiconductor device.

14. A laminated semiconductor device comprising:
a first semiconductor device comprising:
a laminated substrate comprising:
a resin base material,
a plurality of connecting terminals formed in a semiconductor element mounting region on a surface of the resin base material,
a plurality of inter-substrate connecting terminals formed on the other surface of the resin base material,
a first resin coating film formed in an external region excluding the semiconductor element mounting region on the surface of the resin base material, and
a second resin coating film formed on the other surface in a shape exposing at least a part of each of the inter-substrate connecting terminals, wherein the first resin coating film is thinner than the second resin coating film;

a semiconductor element is mounted in the semiconductor element mounting region of the laminated substrate, and a protruding electrode for lamination is on each of the inter-substrate connecting terminals of the laminated substrate; and a second semiconductor device comprising:

a resin wiring substrate according to claim 1 further comprising a plurality of connecting terminals for lamination in the external region on the surface, wherein the first resin coating film is in a shape exposing at least a part of each of the connecting terminals for lamination;

a second semiconductor element mounted in the semiconductor element mounting region of the resin wiring substrate; and protruding electrodes for connection on each of the external terminals for connection of the resin wiring substrate, wherein the inter-substrate connecting terminals of the first semiconductor device are located corresponding to the connecting terminals for lamination of the second semiconductor device, and the connecting terminals for lamination of the second semiconductor device are connected to the inter-substrate connecting terminals of the first semiconductor device via the protruding electrodes for lamination.

15. The laminated semiconductor device according to claim 14, wherein the first resin coating film of the first semiconductor device has an area smaller than an area of the second resin coating film of the first semiconductor device.

16. The laminated semiconductor device according to claim 14, wherein the first resin coating film and the second resin coating film of the first semiconductor device are composed of the same material.

17. The laminated semiconductor device according to claim 16, wherein the first resin coating film and the second resin coating film of the first semiconductor device are composed of a solder resist.

18. The laminated semiconductor device according to claim 14, wherein a thickness of the resin base material of the first semiconductor device is less than or equal to a thickness of the semiconductor element mounted on the first semiconductor device.

19. The laminated semiconductor device according to claim 14, wherein the inter-substrate connecting terminals and the second resin coating film of the first semiconductor device are formed only in a region excluding a region corresponding to the semiconductor element mounting region on the other surface of the resin base material of the first semiconductor device.

20. The laminated semiconductor device according to claim 14, wherein the second resin coating film of the first semiconductor device has a thickness larger than a thickness of the semiconductor element mounted on the first semiconductor device.

21. The laminated semiconductor device according to claim 14, wherein the first resin coating film of the second semiconductor device has a thickness larger than a thickness of the semiconductor element mounted on the second semiconductor device.

22. The resin wiring substrate according to claim 1, wherein the opening is surrounded by the external connecting terminals in each of the separate portions of the second resin coating film.

23. The resin wiring substrate according to claim 1, wherein four external connecting terminals are exposed in each of the separate portions of the second resin coating film.

* * * * *